(12) United States Patent
Abe et al.

(10) Patent No.: US 7,429,796 B2
(45) Date of Patent: Sep. 30, 2008

(54) SEMICONDUCTOR DEVICE AND FABRICATION PROCESS THEREOF

(75) Inventors: Tomoyuki Abe, Kawasaki (JP); Shinya Iijima, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/483,527

(22) Filed: Jul. 11, 2006

(65) Prior Publication Data

US 2007/0222085 A1    Sep. 27, 2007

(30) Foreign Application Priority Data

Mar. 27, 2006  (JP) ............................. 2006-086536

(51) Int. Cl.
*H01L 23/48* (2006.01)
(52) U.S. Cl. ...................... 257/737; 257/778
(58) Field of Classification Search ................. 257/737, 257/738, 778
See application file for complete search history.

(56) References Cited

U.S. PATENT DOCUMENTS

| | | | | |
|---|---|---|---|---|
| 5,084,412 A | * | 1/1992 | Nakasaki | 438/656 |
| 5,906,312 A | * | 5/1999 | Zakel et al. | 228/246 |
| 6,030,895 A | * | 2/2000 | Joshi et al. | 438/679 |
| 6,043,429 A | * | 3/2000 | Blish et al. | 174/361 |
| 6,628,178 B2 | | 9/2003 | Uchikoba | |
| 6,731,003 B2 | * | 5/2004 | Joshi et al. | 257/737 |
| 2005/0127504 A1 | | 6/2005 | Imai | 257/734 |

FOREIGN PATENT DOCUMENTS

| | | |
|---|---|---|
| CN | 1622304 A | 6/2005 |
| JP | 2001-127102 | 5/2001 |
| JP | 2005-191541 | 7/2005 |
| KR | 2005-54834 | 6/2005 |

* cited by examiner

*Primary Examiner*—Roy K Potter
(74) *Attorney, Agent, or Firm*—Kratz, Quintos & Hanson, LLP

(57) ABSTRACT

A semiconductor device includes a mount substrate and a semiconductor chip mounted upon the mount substrate via a metal bump, wherein metal bump includes an inner part joined to the semiconductor chip and an outer part covering the inner part, the outer part having an increased hardness as compared with the inner part.

10 Claims, 10 Drawing Sheets

SEMICONDUCTOR DEVICE AND FABRICATION PROCESS THEREOF

CROSS-REFERENCE TO RELATED APPLICATION

The present application is based on Japanese priority application No. 2006-086536 filed on Mar. 27, 2006, the entire contents of which are hereby incorporated by reference.

BACKGROUND OF THE INVENTION

The present invention generally relates to semiconductor devices and more particularly to a semiconductor device in which a semiconductor chip is mounted upon a package substrate.

In a semiconductor device called high frequency module designed for high frequency applications, an MMIC (monolithic microwave integrated circuit) is formed by mounting a compound semiconductors chip such as a GaAs chip upon a mounting substrate such as a module substrate by flip-chip mounting process. With such semiconductor devices of high frequency applications, Au stud bumps of low resistance are formed on a semiconductor chip and the stud bumps are joined to corresponding Au electrode pads on the mounting substrate upon the flip-chip mounting.

Such joining of Au stud bumps to Au electrode pads is achieved by thermal pressure welding, pressure welding that uses adhesive, ultrasonic joining, or the like, wherein a temperature of 300-400° C. is needed in the case of thermal pressure welding.

Conventionally, ceramic substrates were used for the mounting substrate in such semiconductor devices for high frequency applications, while there is a demand in these days to use low-cost resin substrates for the mounting substrate also in such semiconductor devices for high frequency applications. When a resin substrate is used, however, it is not possible to use thermal welding process, which requires the temperature of 300-400° C. as noted before.

In the case the joining is achieved by adhesive, on the other hand, there is no need of heat treatment, and no problem is caused with regard to the heat resistance of the mounting substrate. However, in the case that an Au stud bump and an Au electrode pad are joined by an adhesive, these members are merely contacted with each other, and problems such as increase of resistance or and snapping wire are tend to be caused when shock or thermal cycling is applied.

Under these situations, there is increasing importance of ultrasonic joining technology that can achieve fusion between the Au stud bump and the Au electrode pad at low temperatures.

In order to achieve reliable and strong joining with such ultrasonic joining technology, the surface state of the metal to be joined is very import.

REFERENCES

Patent Reference 1

Japanese Laid Open Patent Application 2002-76832 official gazette

Patent Reference 2

Japanese Laid Open Patent Application 2001-127102 official gazette

SUMMARY OF THE INVENTION

FIG. 1 shows the fabrication process of an MMIC conducted by a flip-chip process according to a related art of the present invention.

Referring to FIG. 1, there is formed a resin sealing layer 12 including an interconnection pattern 12a at the front side of a compound semiconductors chip 11 such as GaAs, and bump electrodes 12A and 12B are formed in the resin sealing layer 12. Further, Au stud bumps 13A and 13B are formed respectively on the bump electrodes 12A and 12B by an electrolytic plating process.

The semiconductor chip 11 is mounted upon a module substrate 14 by a flip-chip process, and thus, electrode pads 15A and 15B are formed on the module substrate 14 in correspondence to the Au stud bumps 13A and 13B, respectively. In the illustrated example, the electrode pad 15A is formed of a Cu electrode pattern 15a formed on the module substrate 14, and a Ni film 15b is formed on the Cu pattern 15b by a non-electrolytic plating process. Further, an Au film 15c is formed on the Ni film 15b by a non-electrolytic plating process. Similarly, the electrode pad 15B is formed of a Cu electrode pattern 15d formed on the module substrate 14, and a Ni film 15e is formed on the Cu pattern 15d by a non-electrolytic plating process. Further, an Au film 15f formed on the Ni film 15e by a non-electrolytic plating process.

Now, in the case of conducting a flip-chip mounting by using a ultrasonic joining process, it is known that more firm junction is attained when softer metal member, and hence less hard metal member, is used for joining. In the case of an Au member, bulk Au material used for wires is the softest (Vickers hardness of 20-60), and the hardness increases in the order of Au material formed by electrolytic plating process (Vickers hardness of 50 or more) and Au material formed by non-electrolytic plating process (Vickers hardness of 100 or more).

With the semiconductor device of FIG. 1, the Au stud bumps 13A and 13B are formed by electrolytic plating process, and thus, the ultrasonic bonding process provides the junction strength of about 50 MPa. It should be noted that this does not reach the value of 75 MPa or more, which is thought as the criteria for attaining reliable junction.

By using a bulk Au material, it is expected that higher junction strength should be attained for the Au stud bumps 13A and 13B.

When a bulk Au material is used for the Au stud bumps 13A and 13B, on the other hand, there arises a problem in that soft stud bumps cause extensive deformation at the time of ultrasonic joining process as the semiconductor chip is mounted on the module substrate by the flip-chip process, and that such a deformation may cause deterioration in the high frequency characteristics of the semiconductor device such as reflection characteristics or loss. It should be noted that the Au stud bumps 13A and 13B generally have a square shape in the plan view with a size of 40 μm for each edge for example, and that the bumps are provided with a predetermined interval such as 200 μm.

Thus, increase of junction strength of stud bump and the improvement of electric property, particularly high frequency characteristics, have been in contradictory relationship in conventional semiconductor devices, particularly in the high-frequency semiconductor devices, and there have been no solution that can satisfy both of these requirements.

According to an aspect of the present invention, there is provided a semiconductor device, comprising:

a mount substrate; and a semiconductor chip mounted upon said mount substrate via a metal bump, said metal bump comprising an inner part joined to said semiconductor chip and an outer part covering said inner part, said outer part having an increased hardness as compared with said inner part.

According to another aspect of the present invention, there is provided a method of fabricating a semiconductor device including a step of mounting a semiconductor chip upon a mount substrate by a flip-chip process, comprising the steps of:

forming a metal bump on said mount substrate; and forming a plating film on said metal bump, said flip-chip mounting step comprising the sub-steps of:

urging said semiconductor chip against said metal bump such that said electrode pad is urged against said metal bump; and ultrasonically joining said metal bump to said electrode pad by applying an ultrasonic wave to said semiconductor chip.

According to a further aspect of the present invention, there is provided a method of fabricating a semiconductor device comprising the step of flip-chip mounting a semiconductor chip upon a mount substrate, comprising the steps of:

forming a metal bump on said mount substrate by a metal wire carrying a metal plating film thereon;

urging said semiconductor chip against said metal bump on said mount substrate such that an electrode pad on said semiconductor chip is urged against said metal bump; and ultrasonically joining said metal bump to said electrode pad by applying an ultrasonic wave to said semiconductor chip.

According to the present invention, a firm bond is attained for the metal bump because of the ultrasonic joining achieved between the soft, inner part of the metal bump and the electrode pad of the semiconductor chip. At the same time, the soft inner part is reinforced by the outer part of increased hardness, and thus, excessive deformation of the metal bump is prevented successfully at the time of the ultrasonic joining process. Thereby, the problem of offset of high frequency characteristics from a predetermined standard is prevented successfully.

It should be noted that such reinforcement of the metal bump is achieved easily by forming a plating layer of small grain diameter and large hardness for the outer part. Thereby, the metal bump carrying the plating layer may be formed by forming a plating layer on the surface of the metal bump already formed by welding of a metal wire, or by welding a metal wire carrying a plating layer thereon.

Other objects and further features of the present invention will become apparent from the following detailed description when read in conjoining with the attached drawings.

DETAILED DESCRIPTION OF THE INVENTION

First Embodiment

FIGS. 2-7 show the fabrication process of a semiconductor device according to an embodiment of the present invention.

Figure 2:
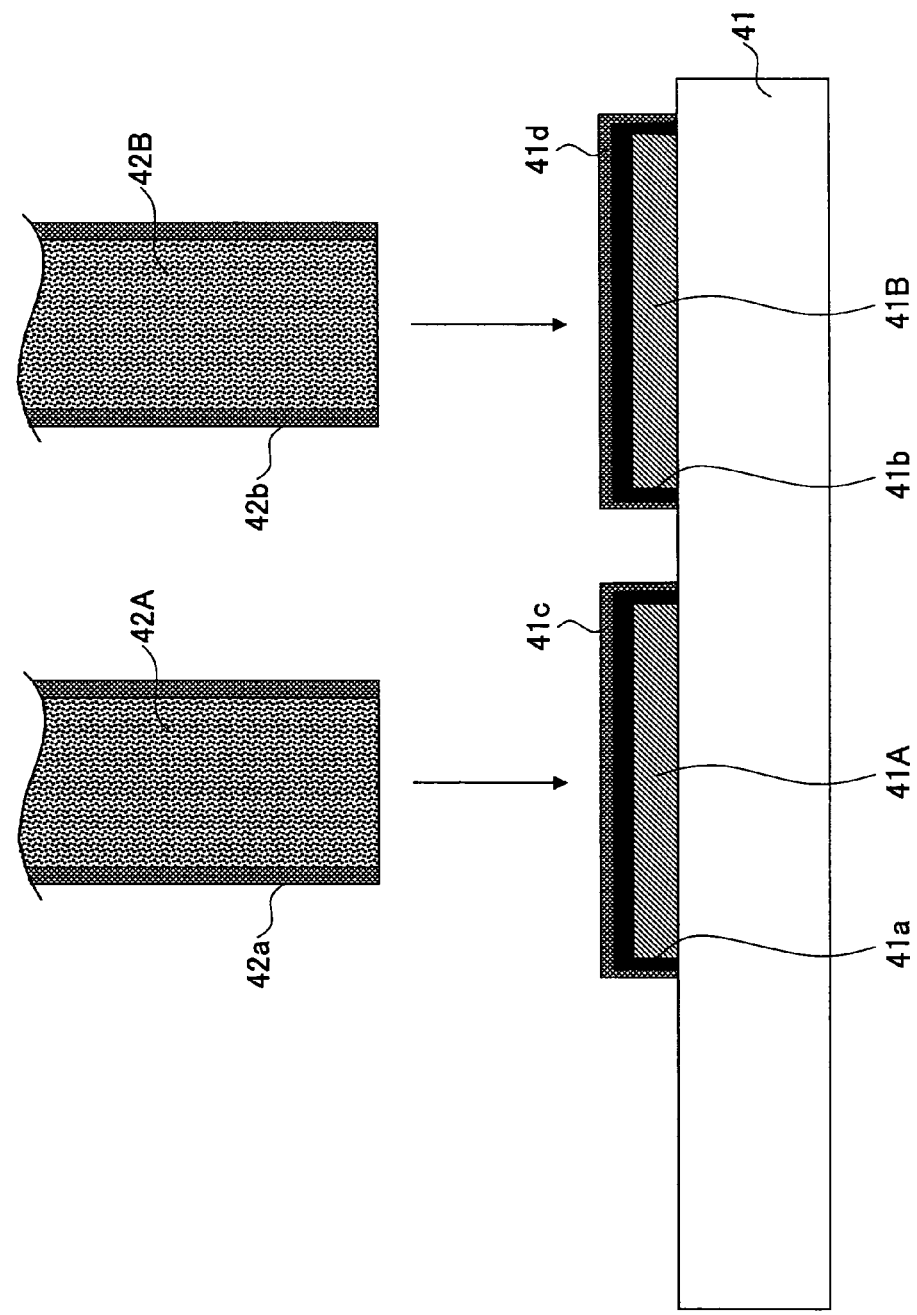
FIGS. 2-7 are diagrams shoring the fabrication process of a semiconductor device according to a first embodiment of the present invention.

Referring to FIG. 2, Cu interconnection patterns 41A and 41B are formed on a resin mount substrate 41 formed for example of glass epoxy, and Ni layers 41a and 41b are formed respectively on the surfaces of the Cu interconnection patterns 41A and 41B by a non-electrolytic plating with the thickness of 3 μm, for example. On the Ni layers 41a and 41b, there are formed Au films 41c and 41d with a thickness of 0.5 μm, for example.

Figure 3:
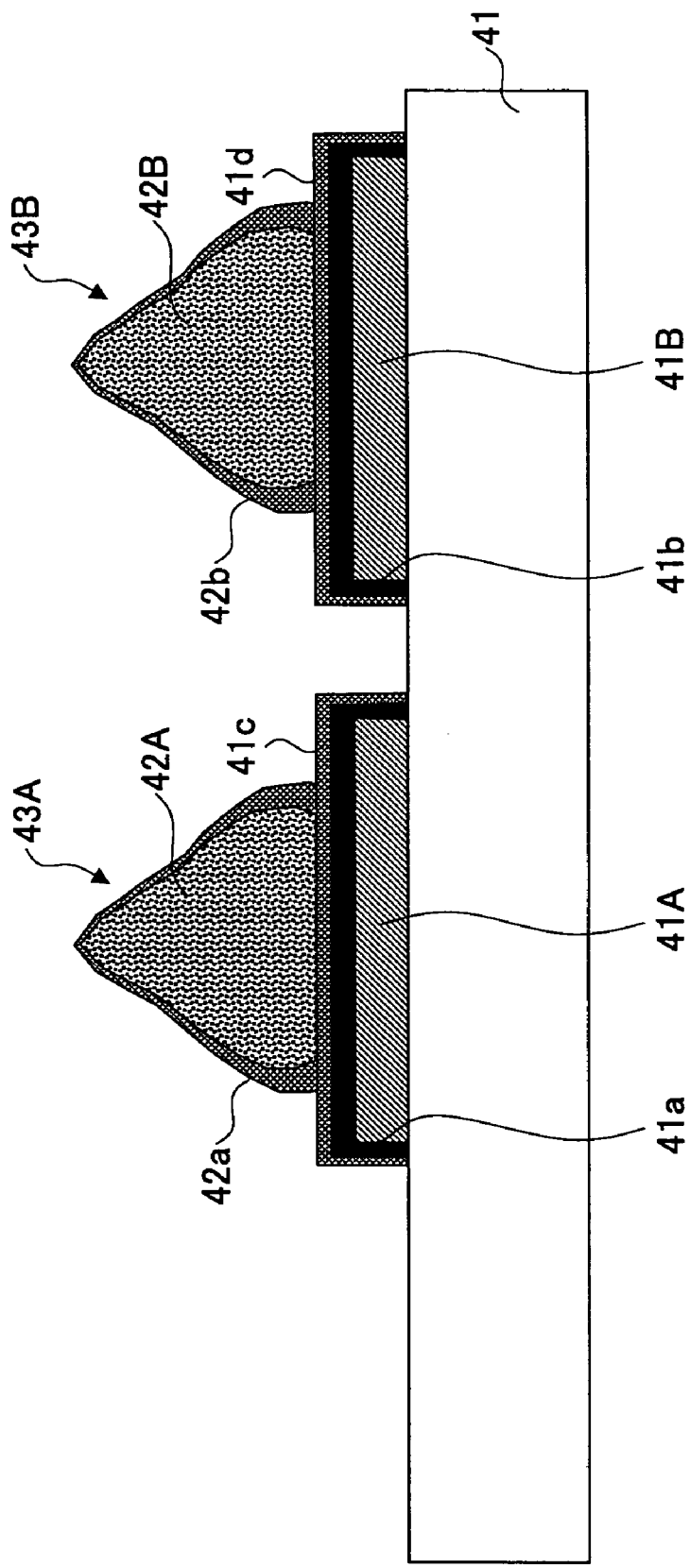

Further, a stud bump 43A having a diameter of about 40 μm is formed on the Au film 41c covering the Cu interconnection pattern 41A as represented in FIG. 3, by welding an Au wire 42A of a diameter of 30 μm, for example, by using a wire bonder, wherein the Au wire 42A carries thereon an Au coating film 42a having a thickness of 1-5 μm, such as 2 μm, formed by a non-electrolytic plating process or electrolytic plating process. Similarly, a stud bump 43B having a diameter of about 40 μm is formed on the Au film 41d covering the Cu interconnection pattern 41B as represented in FIG. 3, by welding an Au wire 42B of a diameter of 30 μm, for example, by using a wire bonder, wherein the Au wire 42B carries thereon an Au coating film 42b having a thickness of 1-5 μm, such as 2 μm, formed by a non-electrolytic plating process or electrolytic plating process. The Au wires 42A and 42B are formed of a bulk Au wire material characterized by a typical grain size of 0.1-0.5 μm and a Vickers hardness of 20-60, typically 50 or less.

On the other hand, the Au films 42a and 42b have a typical grain diameter of 0.01-0.05 μm and a Vickers hardness of 100 or more in the case of being formed by a non-electrolytic plating process. In the case the Au films 42a and 42b are formed by an electrolytic plating process, the coating films 42a and 42b have an intermediate grain diameter of 0.05-0.1 μm and a Vickers hardness of 50 or more.

Hereinafter, explanation will be made for the case of forming the Au coating films 42a and 42b by a non-electrolytic plating process.

Figure 4:
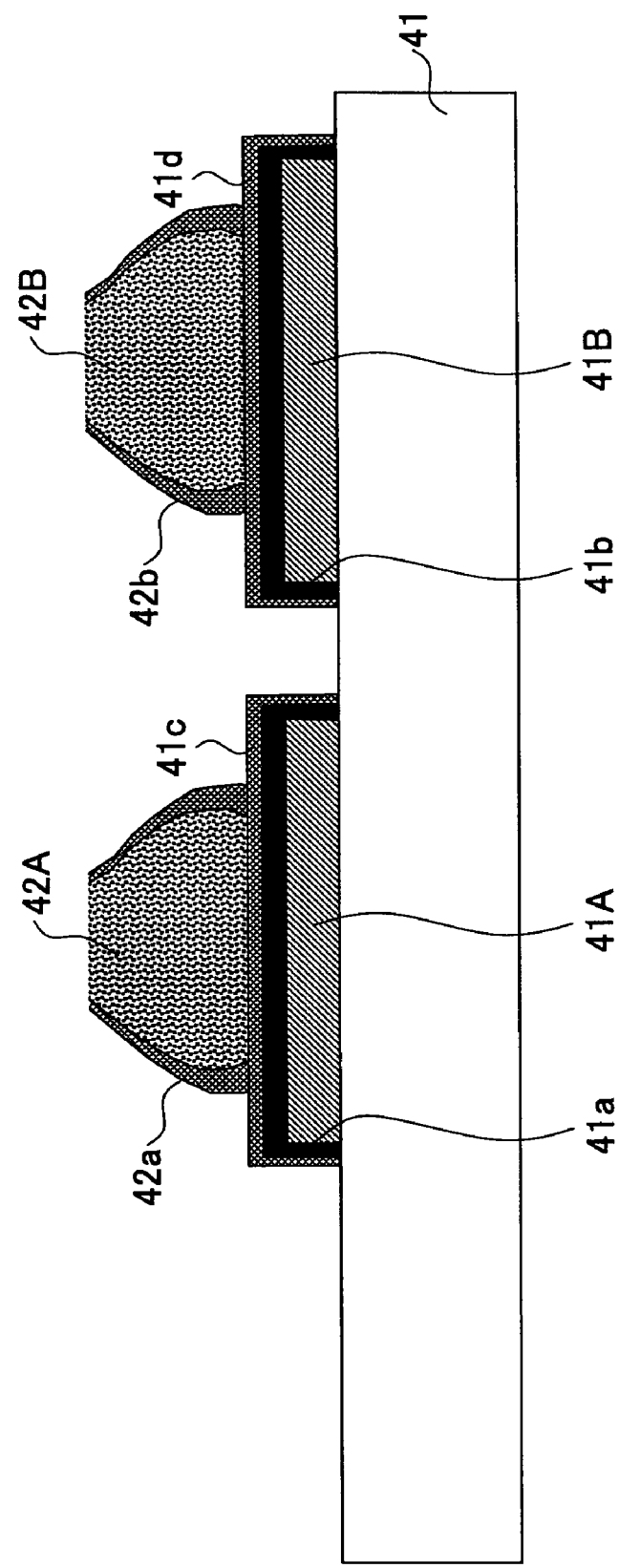

In the step of FIG. 4, a tip end part of the stud bumps 43A and 43B is leveled off by using a cutter or by crushing, such that the Au wire 42A or Au wire 42B is exposed at the tip end part. It should be noted that the leveling process of FIG. 4 may be conducted by urging a flat leveling member against the structure of FIG. 3, or alternatively by urging a semiconductor chip to be mounted as will be explained with reference to FIG. 6.

Figure 5:
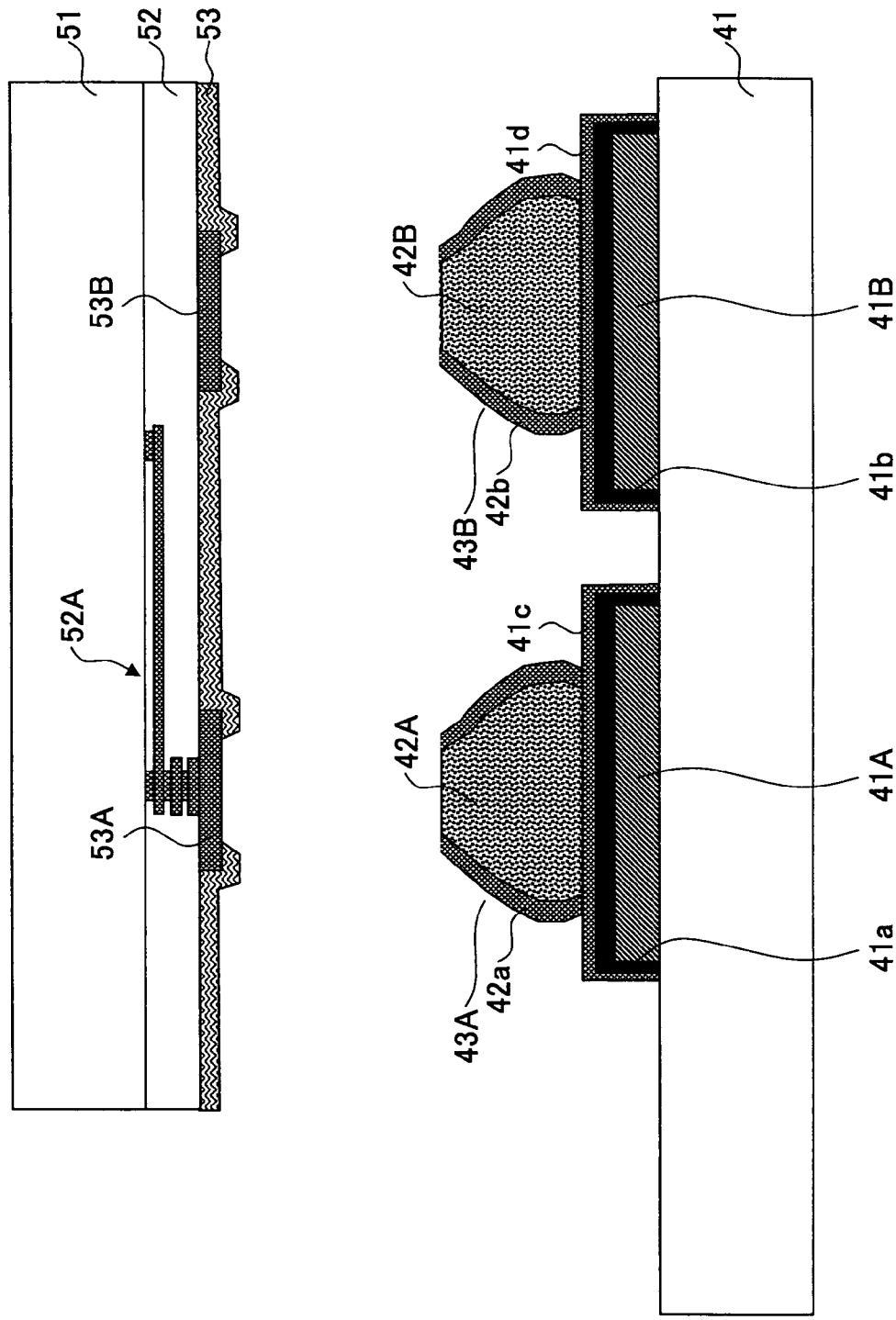

Next, in the step of FIG. 5, a semiconductor chip 51 is disposed on the mount substrate 41 in a turned over state or flip-chip state.

It should be note that the semiconductor chip 51 is an MMIC of a compound semiconductor such as GaAs or InGaAs and there is formed an Au interconnection pattern 52A in a resin seal layer 52 at a front side of the semiconductor chip 51. The interconnection pattern 52A is connected to electrode pads 53A and 53B formed in a protective film 53 covering the surface of the resin seal layer 52.

Figure 6:
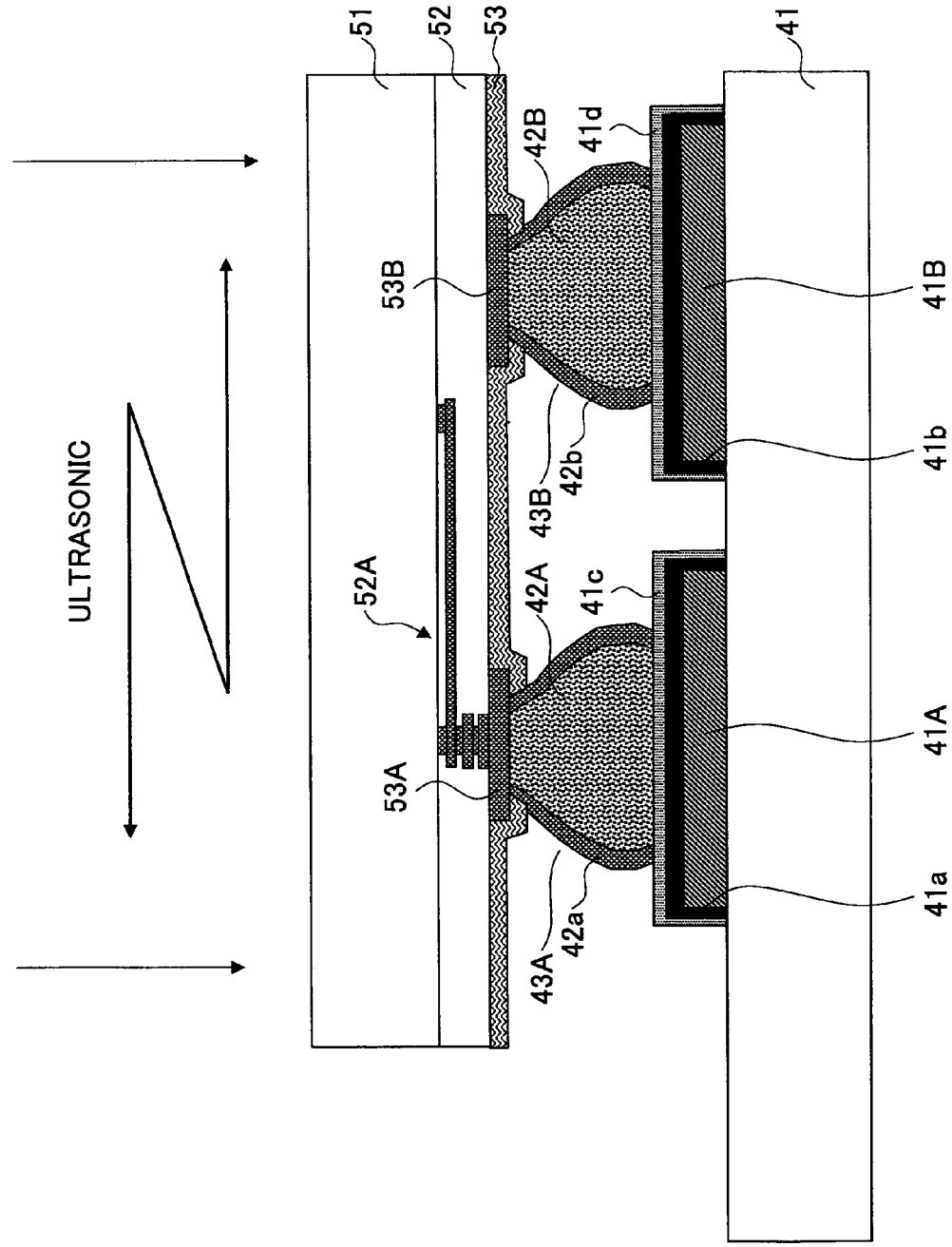

In the step of FIG. 5, the semiconductor chip 51 is held by a bonding tool not illustrated, and the semiconductor chip 51 is urged against the mount substrate 41 with a load of 50 MPa in the step of FIG. 6 as indicated by an arrow, by driving the bonding tool. It should be noted that this load of 50 MPa is the load that provides the maximum junction strength in the ultrasonic joining of Au.

With this, the bump electrodes 53A and 53B of the semiconductor chip 51 are engaged with the tip end parts of the stud bumps 43A and 43B respectively, and the Au bulk materials 42A and 42B exposed at the tip end part are urged against the bump electrodes 53A and 53B, respectively. Thereby, it is also possible to conduct leveling at the tip end part of the stud bumps 43A and 43B in this step, as explained before.

In the step of FIG. 6, the bonding tool is further driven with this state and ultrasonic wave is applied to the chip 51. Thereby, the stud bump 43A is joined ultrasonically to the corresponding electrode pad 53A and the stud bump 43B is joined ultrasonically to the corresponding electrode pad 53B.

Figure 7:
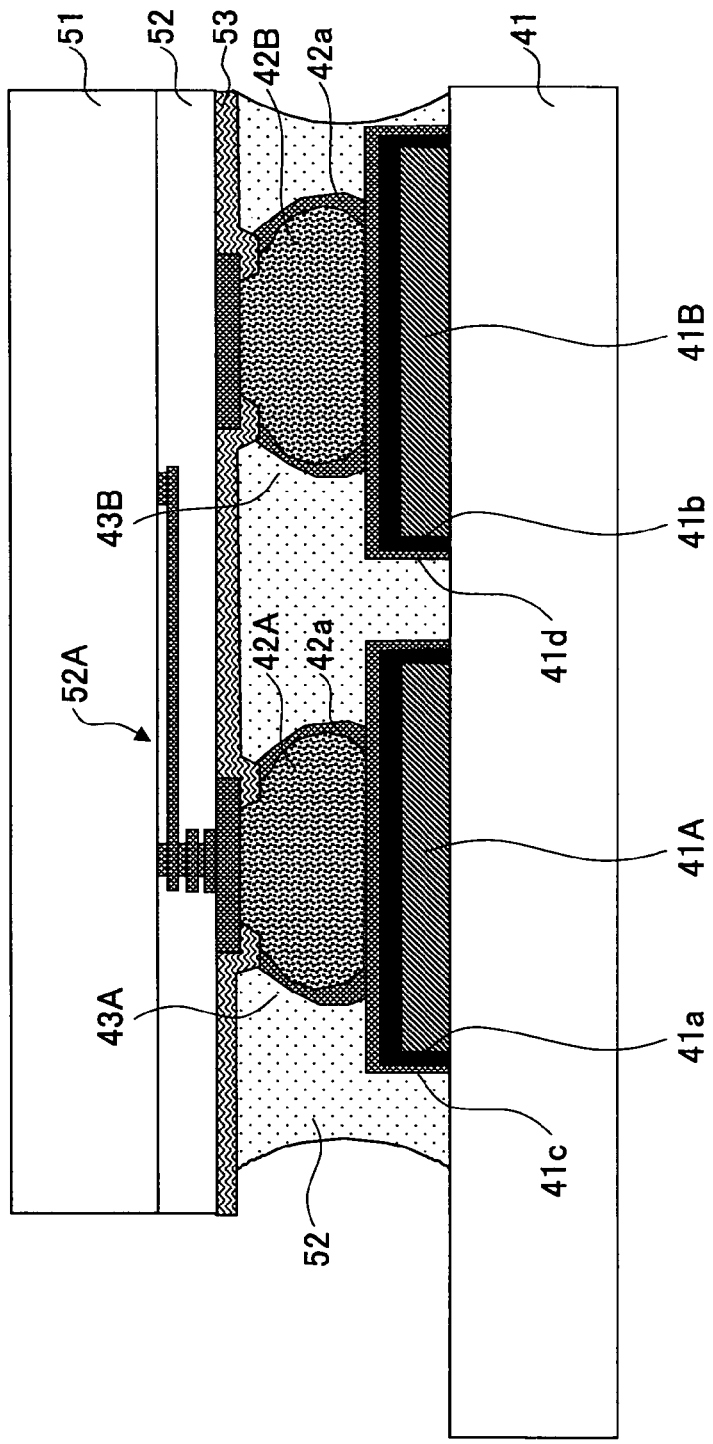

FIG. 7 shows the state of the semiconductor device 40 comprising the substrate 41, the stud bumps 43A and 43B and the semiconductor chip 51 after the ultrasonic joining process. In the state of FIG. 7, it should be noted that a seal resin layer 52 is provided so as to fill the gap between the semiconductor chip 51 and the substrate 41. Such a seal resin is cured at the temperature of 150° C., for example, and reinforces the stud bumps 43A and 43B further.

Figure 1:
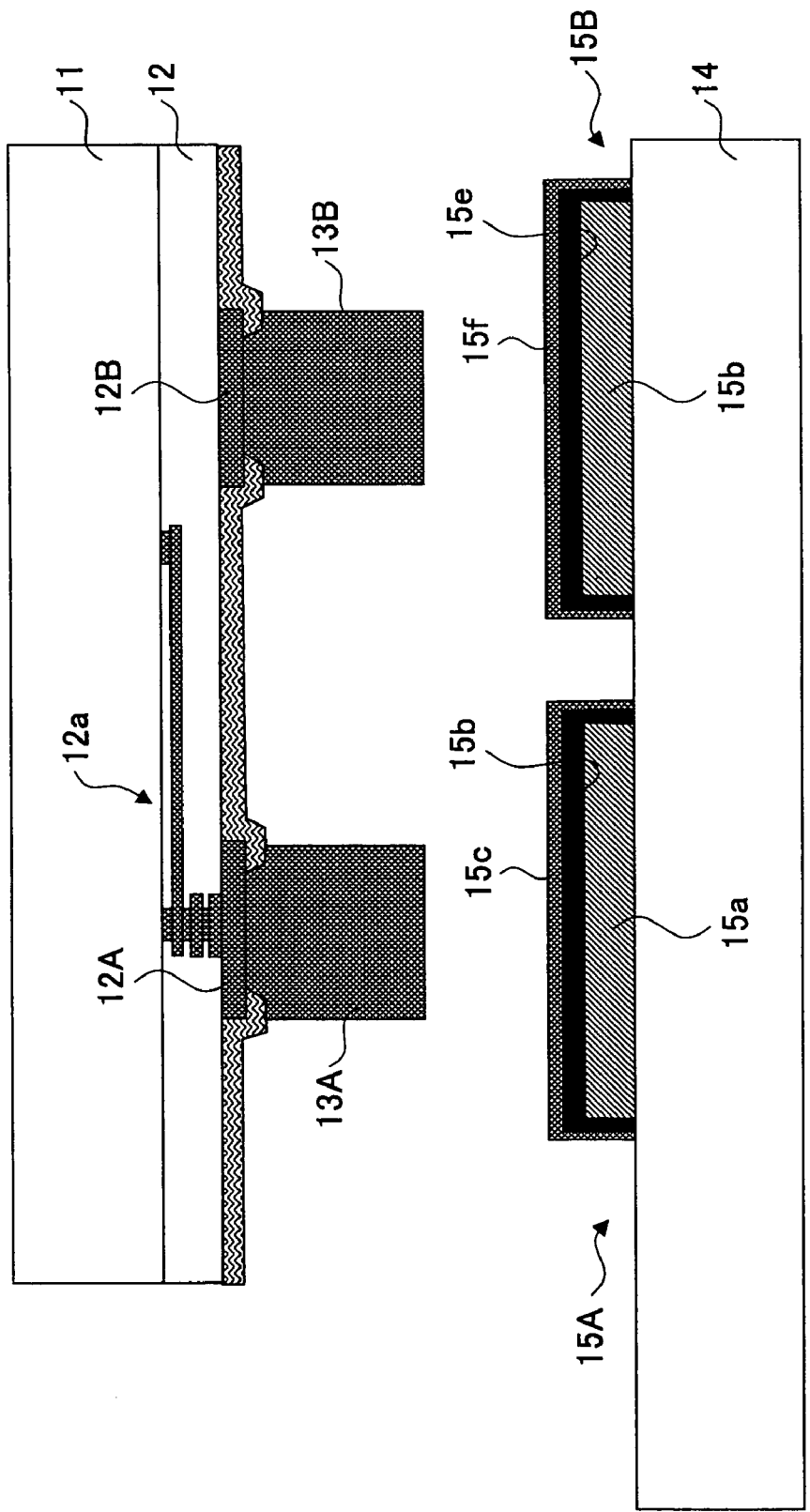
FIG. 1 is a diagram showing the fabrication process of a semiconductor device according to a related art of the present invention.

With the semiconductor device 40 of FIG. 7, it was confirmed that junction strength of about 80 MPa is achieved for the inner parts 42A and 42B of the stud bumps 43A and 43B of bulk Au material with regard to the corresponding electrodes 53A and 53B, wherein it should be noted that this junction strength exceeds the desired junction strength of 75 MPa. Further, it should be noted that the junction strength thus achieved is larger than the junction strength for the case of forming the stud bump by the electrolytic plating process as taught in the related art of FIG. 1 by 60% or more.

Figure 8:
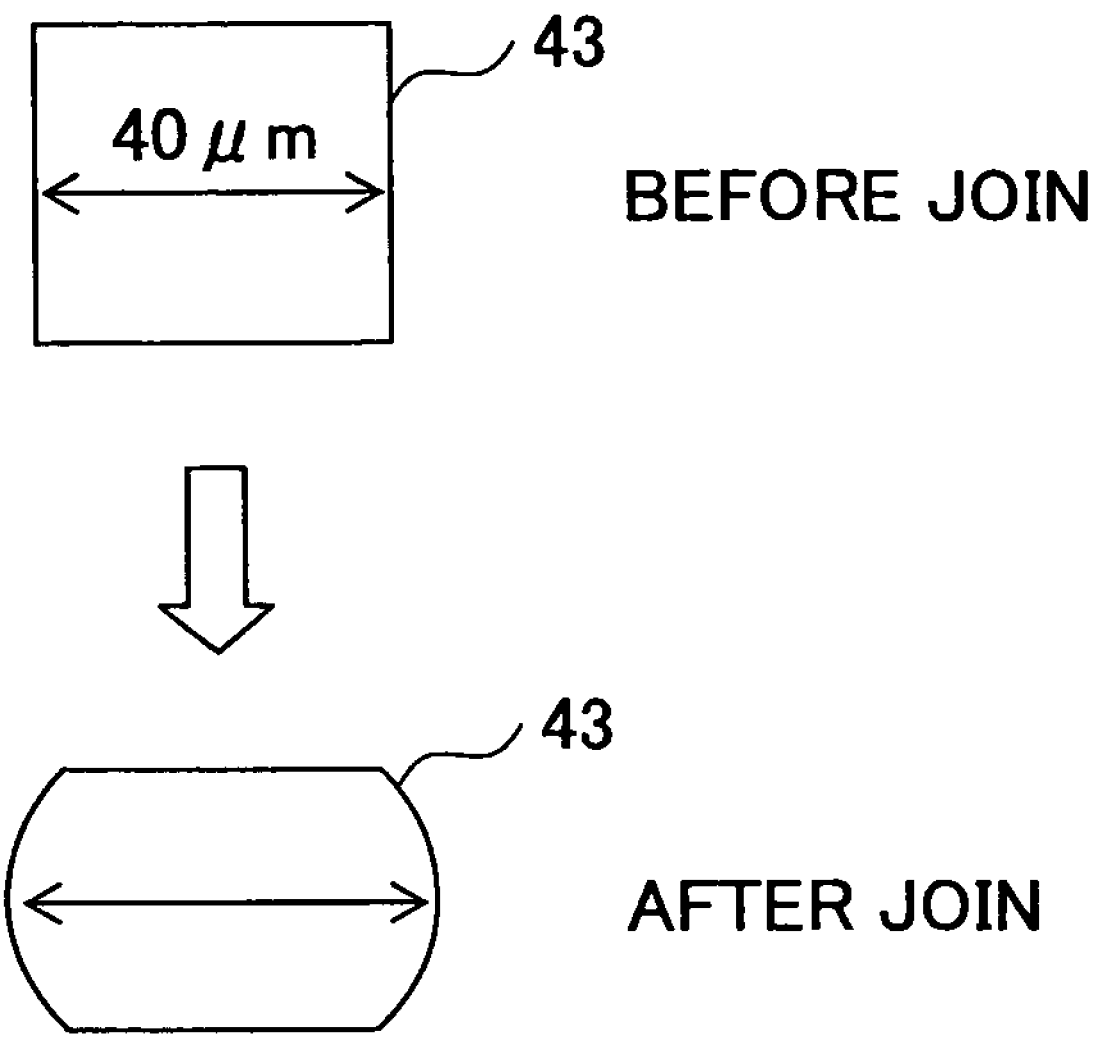
FIG. 8 is a diagram showing the deformation of the stud bump in the semiconductor device of the first embodiment of the present invention.

FIG. 8 compares the shape of the stud bump 43A of FIG. 5 before the joining with the stud bump 43A of FIG. 7 after the joining.

Referring to FIG. 8, the stud bump 43A has a square shape having a size of 40 μm for each edge in the plan view before the joining step, while it can be seen that there is caused an increase of width in the direction parallel to an edge after the joining step of FIG. 7.

Thereby, with the semiconductor device 40 of FIG. 7, in which the stud bumps 43A and 43B are reinforced by the respective outer parts of the non-electrolytic plating layers 42a and 42b having large hardness and the thickness of 2 μm, and thus occupying the proportion of 5% of the entire width, lateral spreading, and hence increase of width, of the stud bumps 43A and 43B, is effectively suppressed in the state of FIG. 8 corresponding to the state of FIG. 7 in which the joining is already made, and the width of the stud bumps 43A and 43B is maintained within the range from 45 μm corresponding to the initial width to about 50 μm in the state of FIG. 7. In the case of FIG. 8, the ratio of increase of the bump width is 25%.

Thus, by suppressing the deformation of the stud bump such that a first width of the part thereof of the maximum width is held within 1.3 times of a second width for the part of the minimum width, it becomes possible to suppress the deterioration of the reflection characteristics to −10 dB or less and the loss to 5 dB or less. Thus, a predetermined performance is guaranteed for the semiconductor device 40.

Further, a thermal cycling test was conducted for the semiconductor device 40 thus formed between the temperature of −55° C. and the temperature of 150° C., and it was confirmed that increase of contact resistance between the bump and the conductor pattern is suppressed within 10% even when the number of thermal cycles has exceeded 3000. Thus, it was confirmed that satisfactory reliability of connection is attained with such a construction of the present invention.

Further, experiments were also conducted for the case of forming the non-electrolytic plating layers 42a and 42b with the thickness of 5 μm. In this case, the non-electrolytic plating layers 42a and 42b occupy the proportion of 14% of the total width of the stud bump. In such a case, too, it was confirmed that the junction strength of 80 MPa is obtained, while it was also confirmed that the rate of increase of the bump width is 17.5%. In this case, the deformation of the stud bump is suppressed further, and deterioration of high frequency characteristics of the semiconductor device 40 is suppressed further.

While the embodiment of FIGS. 2-7 forms the resin seal layer 52 between the semiconductor chip 51 and the mount substrate 41 after the mounting of the semiconductor chip 51 on the mount substrate 41, it is also possible to apply a non-conductive paste (NCP) layer on the surface of the mount substrate 41 and conduct the ultrasonic joining by urging the semiconductor chip against the non-conductive paste layer.

In this case, too, it is confirmed that no problem of connection reliability takes place even when the previously explained thermal cycling process is repeated for 1000 times.

COMPARATIVE EXAMPLE

In the case the same device structure is formed without providing the non-electrolytic plating layers 42a and 42b, junction strength of about 85 MPa is attained, while this junction strength exceeds the required junction strength. However, it was observed that the rate of increase of the stud bump width reaches as much as 32.5%, and thus, there is caused a serious degradation of high frequency performance in the semiconductor device.

Further, in the case the stud bumps 43A and 43B are formed by the electrolytic plating process, it was observed that the rate of increase f the stud bump width is 12.5%, and thus, the semiconductor device provides the predetermined performance with regard to the high frequency characteristics. On the other hand, it was observed that the junction strength is 50-70 MPa, and it is not possible to provide satisfactory connection reliability.

Second Embodiment

Figure 9:
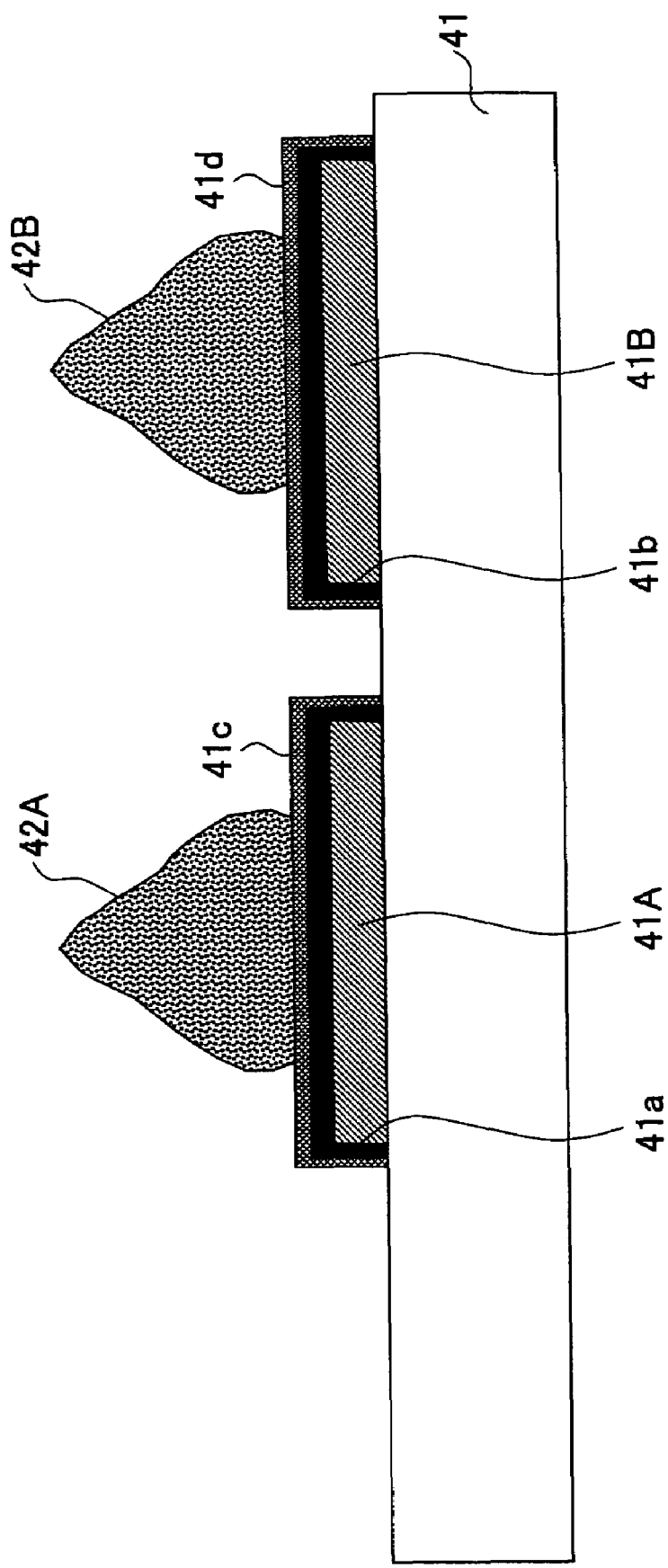
FIGS. 9 and 10 are diagrams showing the fabrication process of a semiconductor device according to a second embodiment of the present invention.
Figure 10:
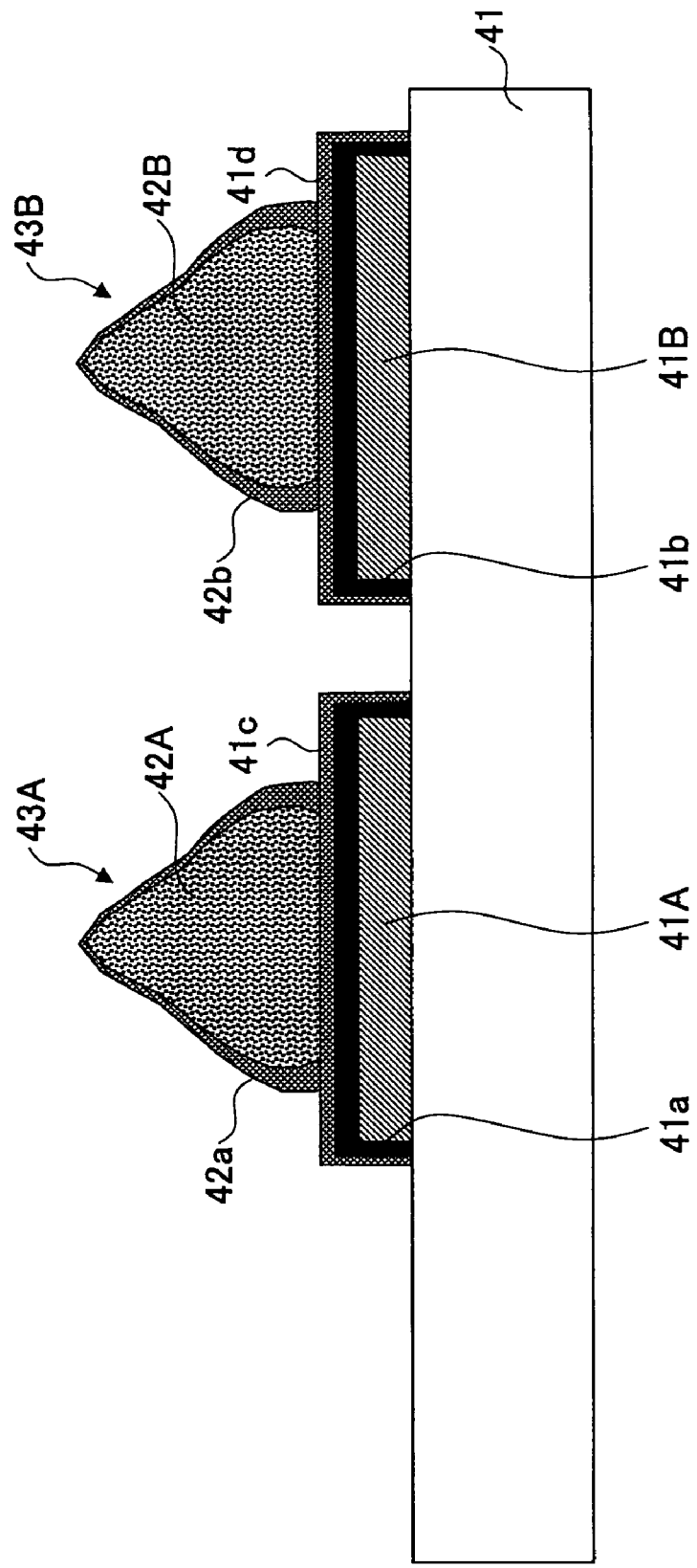

FIGS. 9 and 10 show a part of the fabrication process of a semiconductor device according to a second embodiment of the present invention, wherein those parts corresponding to the parts described previously are designated by the same reference numerals and the description thereof will be omitted.

Referring to FIG. 9, studs 42A and 42B of bulk Au are formed on the mount substrate 41 in correspondence to the Cu interconnection patterns 41A and 41B by way of wire bonding of an Au wire, wherein the Cu interconnection patterns 41A and 41B are covered by Au films 41c and 41d, respectively.

Next, with the present embodiment, the surface of the substrate 41 is covered by a resist film (not shown) up to the level corresponding to the height of the Au films 41c and 41d, and Au coating films 42a and 42b are formed on the studs 42A and 42B respectively by a non-electrolytic plating process or electrolytic plating process with the thickness of 2-5 μm. The Au coating films 42a and 42b thus formed function as the reinforcement layer of the stud bumps 43A and 43B.

After the step of FIG. 10, the process of FIGS. 4-7 is conducted, and the semiconductor device 40 is obtained similarly to the previous embodiment in that the MMIC chip 51 is flip-chip mounted on the mount substrate 41.

While the present invention has been explained heretofore for the example of the semiconductor device in which the Au stud bump is joined by ultrasonic joining process, the present invention is not limited to such a semiconductor device that uses pure Au stud bump. Thus, suppressing of degradation of semiconductor device characteristics by the reinforcement film on the stud bump according to the present invention is effective also in the case the stud is formed by a bump material that contains at least one of Au, Ag, Sn and Pb.

Thereby, the material reinforcing the stud bump is not limited to the material formed by non-electrolytic plating process, and any material can be used for this purpose as long as the hardness thereof is larger than that of the stud bump and it can suppress the width of the stud bump for the part where the width is maximum to be 1.3 times or less of the width of the part where the width is minimum in the state after the joining process. For example, it is possible use at least one of Au, Ag, Pd, Cu, Sn and Pb.

While the present invention has been explained heretofore for preferred embodiments, the present invention is by no means limited to such a specific embodiment and various variations and modifications may be made within the scope of the present invention.

What is claimed is:

1. A semiconductor device, comprising:
   a mount substrate; and
   a semiconductor chip mounted upon said mount substrate via a metal bump,
   said metal bump comprising an inner part joined to said semiconductor chip and an outer part covering said inner part,
   said outer part having an increased hardness as compared with said inner part,
   said inner part and said outer part commonly containing a metal element.

2. The semiconductor device as claimed in claim 1, wherein said metal bump has a width, in a part thereof where the width is the largest, of 1.3 times or less as compared with a part there the width is minimun.

3. The semiconductor device as claimed in claim 1, wherein said outer part has a thickness of 1-5 μm.

4. The semiconductor device as claimed in claim 1, wherein said inner part has a first average grain size, and wherein said outer part has a second average grain size smaller than said first average grain size.

5. The semiconductor device as claimed in claim 1, wherein said outer part is formed by conducting a non-electrolytic plating process on said inner part.

6. The semiconductor device as claimed in claim 1, wherein said outer part is formed by conducting an electrolytic plating process on said inner part.

7. The semiconductor device as claimed in claim 1, wherein said inner part is formed of at least one of Au, Ag, Sn and Pb.

8. The semiconductor device as claimed in claim 1, wherein said outer part is formed of at least one of Au, Ag, Sn, Pd, Cu, Sn and Pb.

9. The semiconductor device as claimed in claim 1, wherein said semiconductor chip includes therein a semiconductor device of any of high frequency, microwave or millimeter wave application.

10. The semiconductor device as claimed in claim 1, wherein said mount substrate is formed of a resin substrate.

* * * * *